US009620243B2

(12) United States Patent
Park

(10) Patent No.: US 9,620,243 B2
(45) Date of Patent: Apr. 11, 2017

(54) TEST SYSTEM SIMULTANEOUSLY TESTING SEMICONDUCTOR DEVICES

(71) Applicant: Sunghun Park, Suwon-si (KR)

(72) Inventor: Sunghun Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/731,784

(22) Filed: Jun. 5, 2015

(65) Prior Publication Data

US 2016/0099077 A1 Apr. 7, 2016

(30) Foreign Application Priority Data

Oct. 2, 2014 (KR) ........................ 10-2014-0133453

(51) Int. Cl.
G11C 29/44 (2006.01)
G11C 17/16 (2006.01)
G11C 29/06 (2006.01)
G11C 29/26 (2006.01)

(52) U.S. Cl.
CPC .............. G11C 29/44 (2013.01); G11C 29/06 (2013.01); G11C 29/26 (2013.01); G11C 2029/2602 (2013.01)

(58) Field of Classification Search
CPC ............................................ G11C 2029/2602
USPC .......................................................... 365/96
See application file for complete search history.

(56) References Cited

U.S. PATENT DOCUMENTS

| 6,528,817 | B1* | 3/2003 | Koga ..................... G11C 29/26 257/390 |
| 6,957,403 | B2 | 10/2005 | Wang et al. |
| 7,215,134 | B2 | 5/2007 | Marr |
| 7,509,607 | B2 | 3/2009 | Ikeda |
| 8,072,253 | B2 | 12/2011 | Kaeriyama et al. |
| 8,208,326 | B1* | 6/2012 | Solt ........................ G11C 29/10 365/201 |
| 8,214,699 | B2 | 7/2012 | Arsovski et al. |
| 8,448,030 | B2 | 5/2013 | Tiwary et al. |
| 8,473,792 | B2 | 6/2013 | Chakravarty |
| 8,589,750 | B2 | 11/2013 | Banerjee et al. |
| 8,671,317 | B2 | 3/2014 | Anzou et al. |
| 2003/0191998 | A1* | 10/2003 | Nakamura ....... G01R 31/31813 714/733 |
| 2005/0099862 | A1* | 5/2005 | Lunde .................. G11C 29/006 365/201 |
| 2008/0126892 | A1* | 5/2008 | Dubey ............... G11C 29/1201 714/718 |

(Continued)

FOREIGN PATENT DOCUMENTS

JP 2004-095802 3/2004
JP 2004-226220 8/2004

Primary Examiner — Anthan Tran
Assistant Examiner — Mushfique Siddique
(74) Attorney, Agent, or Firm — Volentine & Whitt, PLLC

(57) ABSTRACT

Individual memory chips are simultaneously tested by a tester using selectively enabled stress modules that apply a corresponding stress test to memory cells, wherein each stress test is associated with a corresponding failure attribute for the memory cells. Built-in self-test (BIST)/built-in self-stress (BISS) circuitry is provided in each stress module and may configured to selectively apply one or more stress test(s) during the simultaneous testing of a plurality of memory chips.

18 Claims, 10 Drawing Sheets

(56) References Cited

U.S. PATENT DOCUMENTS

| | | | |
|---|---|---|---|
| 2009/0154272 A1* | 6/2009 | Chung | G11C 17/16 365/201 |
| 2009/0193302 A1* | 7/2009 | Bingo | G11C 29/40 714/718 |
| 2011/0209012 A1* | 8/2011 | Tiwary | G11C 29/18 714/718 |
| 2012/0072788 A1* | 3/2012 | Chen | G11C 29/06 714/718 |
| 2015/0155055 A1* | 6/2015 | Kim | G11C 17/16 365/96 |
| 2015/0243374 A1* | 8/2015 | Sohn | G06F 11/27 365/96 |
| 2015/0262710 A1* | 9/2015 | Chakravarty | G11C 29/38 714/718 |

\* cited by examiner

FIG. 5

| | first failure attribute | second failure attribute | third failure attribute | fourth failure attribute | fifth failure attribute | sixth failure attribute |
|---|---|---|---|---|---|---|
| Memory Chip1 | necessary stress | necessary stress | necessary stress | unnecessary stress | unnecessary stress | unnecessary stress |
| Memory Chip2 | unnecessary stress | unnecessary stress | unnecessary stress | necessary stress | necessary stress | necessary stress |
| Memory Chip3 | necessary stress | necessary stress | unnecessary stress | unnecessary stress | unnecessary stress | necessary stress |
| Memory Chip4 | unnecessary stress | necessary stress | unnecessary stress | necessary stress | unnecessary stress | unnecessary stress |

FIG. 6

| Memory Chip1 | first failure attribute (20 minutes) | second failure attribute (20 minutes) | third failure attribute (20 minutes) |
|---|---|---|---|
| Memory Chip2 | fourth failure attribute (20 minutes) | fifth failure attribute (20 minutes) | sixth failure attribute (20 minutes) |
| Memory Chip3 | first failure attribute (30 minutes) | sixth failure attribute (20 minutes) | |
| Memory Chip4 | second failure attribute (40 minutes) | | fourth failure attribute (20 minutes) |

TS ... T0

60 min

TEST SYSTEM SIMULTANEOUSLY TESTING SEMICONDUCTOR DEVICES

CROSS-REFERENCE TO RELATED APPLICATION

This application claims priority under 35 U.S.C. §119 to Korean Patent Application No. 10-2014-00133453 filed on Oct. 2, 2014, the subject matter of which is hereby incorporated by reference.

BACKGROUND

Embodiments of the inventive concept relate generally to the testing of semiconductor devices. More particularly, the inventive concept relates to the simultaneous, yet individually tailored, testing of a plurality of memory chips using stress tests respectively associated with corresponding failure attributes.

Many different failure attributes may afflict contemporary memory chips. Yet, memory chips must be tested in an efficient manner that does not overly stress the subject memory chips. As the type and number of failure attributes increases it becomes harder and harder to efficiently test memory chips without overly stressing them.

SUMMARY

Embodiments of the inventive concept provide test systems capable of efficiently and simultaneously testing a plurality of semiconductor devices, such as memory chips without unduly stressing the semiconductor devices. Other embodiments of the inventive concept provide methods of testing semiconductor devices.

According to one embodiment of the inventive concept, a test system includes; a plurality of memory chips including a first memory chip and a second memory chip, and a tester that simultaneously tests the plurality of memory chips, wherein the first memory chip comprises a first memory cell array including memory cells susceptible to a first failure attribute, and first built-in self-test (BIST)/built-in self-stress (BISS) circuitry, the second memory chip comprises a second memory cell array including memory cells susceptible to a second failure attribute, and second BIST/BISS circuitry, the first BIST/BISS circuitry is configured to selectively apply a first stress test associated with the first failure attribute and a second stress test associated with the second failure attribute to the first memory cell array, and the second BIST/BISS circuitry is configured to selectively apply the first stress test and the second stress test to the second memory cell array, and during the simultaneous testing of the plurality of memory cells, the first BIST/BISS applies the first stress test to the first memory cell array and omits the second stress test, while the second BIST/BISS applies omits the first stress test and applies the second stress test to the second memory cell array.

According to another embodiment of the inventive concept, a method of simultaneously testing a plurality of memory chips including a first memory chip and a second memory chip using a tester is provided. The method includes; configuring a first stress module disposed on the first memory chip and including a first stress module that includes first built-in self-test (BIST)/built-in self-stress (BISS) circuitry to selectively apply a first stress test associated with a first failure attribute to a first memory cell array disposed on the first memory chip, and configuring a second stress module disposed on the first memory chip and including second BIST/BISS circuitry to selectively apply a second stress test associated with a second failure attribute to the first memory cell array, and configuring a first stress module disposed on the second memory chip and including a first stress module that includes the first BIST/BISS circuitry to selectively apply the first stress test to a second memory cell array disposed on the second memory chip, and configuring a second stress module disposed on the second memory chip and including the second BIST/BISS circuitry to selectively apply the second stress test to the second memory cell array.

According to another embodiment of the inventive concept, a method of simultaneously testing a plurality of memory chips including a first memory chip and a second memory chip using a tester includes; performing a wafer-level test on the plurality of memory chips during which repair information associated with the first memory chip and second memory chip is acquired, and generating first failure attribute information from repair information associated with the first memory chip, and second failure attribute information from repair information associated with the second memory chip.

The foregoing method may also include running an adaptive burn-in operation during which first built-in self-test (BIST)/built-in self-stress (BISS) circuitry disposed on the first memory chip applies a first stress test associated with the first failure attribute to a first memory cell array of the first memory chip and second BIST/BISS circuitry disposed on the first memory chip omits application of a second stress test associated with the second failure attribute with respect to the first memory cell array, while simultaneously, first BIST/BISS circuitry disposed on the second memory chip omits application of the first stress test with respect to a second memory cell array of the second memory chip and second BIST/BISS circuitry disposed on the second memory chip applies the second stress test to the second memory cell array.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 5 shows types of exemplary failure attributes with respect to memory chips shown in FIG. 1;

FIG. 6 shows failure attributes with respect to the memory chips shown in FIG. 1 and test time according to the failure attributes;

DETAILED DESCRIPTION

Figure 1:
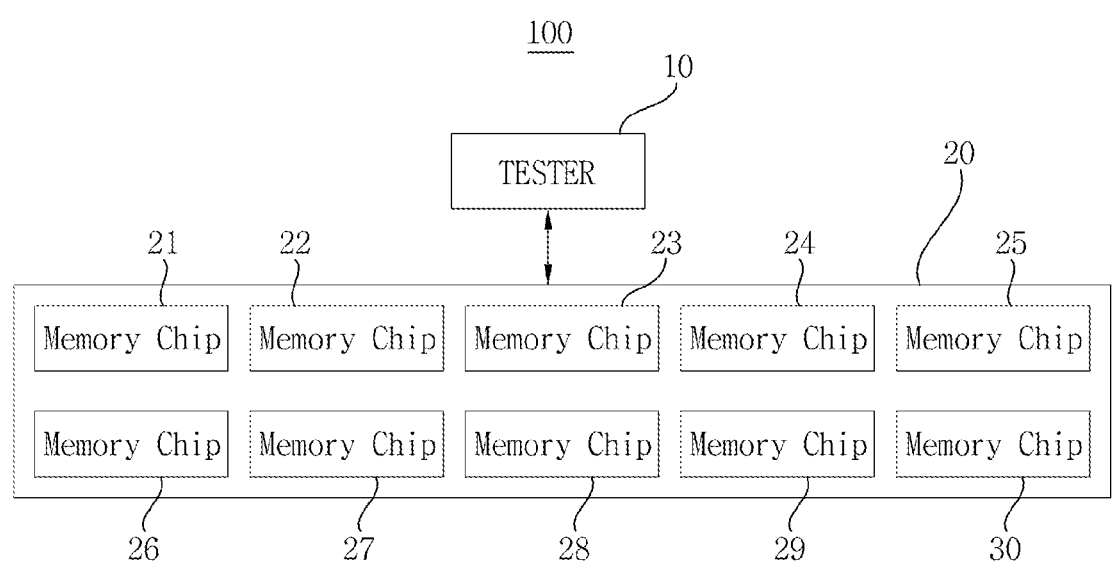
FIG. 1 is a block diagram illustrating a test system according to an embodiment of the inventive concept.

Specific structural and functional details disclosed herein are merely representative for purposes of describing embodiments of the inventive concept. Embodiments of the inventive concept may be implemented in many different forms and the scope of the inventive concept should not be construed as being limited to only the illustrated embodiments presented herein.

It will be understood that, although the terms "first," "second," etc. may be used herein to describe various components, these components should not be limited by these terms. These terms are only used to distinguish one component from another component. Thus, a first component discussed below could be termed a second component and the second component discussed below could be termed the first component without departing from the teachings of the present inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein.

Where it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

FIG. 1 is a block diagram illustrating a test system 100 for semiconductor devices according to an embodiment of the inventive concept.

Referring to FIG. 1, the test system 100 comprises a tester 10 and a plurality of semiconductor devices (e.g., memory chips 20) undergoing testing. FIG. 1 shows only ten (10) memory chips being tested by the tester 10, but those skilled in the art will recognize that this number is merely an arbitrarily chosen example.

The tester 10 may include certain automatic test equipment (ATE) capable of variously testing (e.g., selectively stressing) any one of the first through tenth memory chips 21 to 30. For example, the tester 10 may simultaneously test the first through tenth memory chips 21 to 30 during an applied wafer-level test operation or package-level test operation by applying a test data pattern to a respective input port of the first through tenth memory chips 21 to 30 and comparing a corresponding output for each of the first through tenth memory chips 21 to 30 with an expected value.

Embodiments of the inventive concept, like the one illustrated in FIG. 1, may be applied to many different types of semiconductor devices. For example, the first through tenth memory chips 21 to 30 may be dynamic random access memory (DRAM) or similar non-volatile memory devices. In certain embodiments of the inventive concept, the semiconductor devices undergoing testing (e.g., each one of the first through tenth memory chips 21 to 30) may include a Built-In Self Stress (BISS) and/or Built-In SelfTest (BIST) circuitry. Such on-chip BISS/BIST circuitry may be used with good advantage by the tester 10 to individually, collectively or in-part test the first through tenth memory chips 21 to 30.

For example, the tester 10 may simultaneously test the respective memory chips 21 to 30 in the plurality of memory chips 20 in respectively different ways using the constituent BISS/BIST circuitry of the memory chips 21 to 30. That is, the tester 10 may apply different types or levels of stress to respective memory chips 21 to 30 using the BISS/BIST circuitry during (e.g.,) a burn-in operation for the memory chips 21 to 30. In this context, the terms "simultaneous" or "simultaneously" mean that the time periods during which testing procedure(s) are applied to two or more semiconductor devices overlap at least in part.

During one or more wafer-level test operation(s), the tester 10 may identify and collect data associated with one or more failure attribute(s) with respect to each of the first through tenth memory chips 21 to 30. In this manner, failure attribute information may be acquired for each one of the memory chips 21 to 30. Such failure attribute information may be acquired by static or dynamic testing of the memory chips 21 to 30, and/or repair (or mitigation) of identified defects in the memory chips 21 to 30. In this manner, the tester 10 may acquire "failure attribute information" associated with a number of different failure attributes (e.g., first, second, third, etc., failure attributes), where each one of the memory chip 21 to 30 may exhibit none, one, or more than one of these failure attributes.

Figure 2:
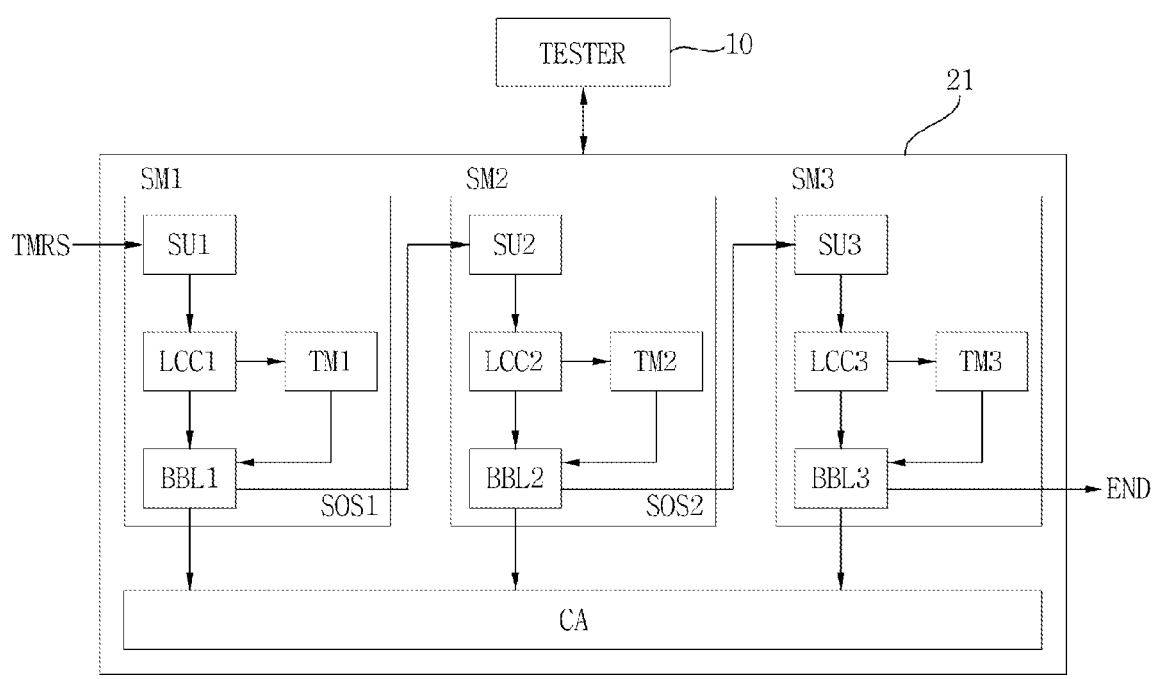
FIG. 2 is a block diagram further illustrating in one example the memory of FIG. 1.

FIG. 2 is a block diagram further illustrating in one example the test system 100 of FIG. 1. Here, only a single memory chip (e.g., memory chip 21) is shown in operative connection to the tester 10. The other memory chips (e.g., memory chips 22 to 30) may be similarly tested following the example described with respect to memory chip 20.

In FIG. 2, it is assume that the first memory chip 21 includes first, second and third stress modules (SM1, SM2 and SM3), as well as a memory cell array CA. Those skilled in the art will understand that various driving circuitry associated with the memory cell array CA of will also be present in the first memory chip 21, but is not specifically illustrated in FIG. 2 for purposes of clarity.

The first stress module SM1 includes a first storage unit SU1, a first logic control circuit LCC1, a first timer TM1, and a first BISS/BIST circuitry BBL1. The second stress module SM2 includes a second storage unit SU2, a second logic control circuit LCC2, a second timer TM2, and a second BISS/BIST circuitry BBL2, and the third stress module SM3 includes a third storage unit SU3, a third logic control circuit LCC3, a third timer TM3, and a third BISS/BIST circuitry BBL3.

The first storage unit SU1 may be used to store failure attribute information related to a first failure attribute as well as information related to the operation of the first timer TM1. This is similarly so for second and third failure attributes and the second and third storage units SU2 and SU3. In certain embodiments of the inventive concept, each one of the first, second and third storage units SU1, SU2 and SU3 may include circuitry providing laser fuse, e-fuse, and/or anti-fuse elements sufficient to store at least a portion of the failure attribute information. The example of FIG. 2 shows only three (3) stress modules (SU) respectively associated with three (3) failure attributes that may be exhibited by the first memory chip 21, but the scope of the inventive concept is not limited to this arbitrarily chosen and exemplary number.

Each one of the first, second and third storage units SU1, SU2 and SU3 respectively disposed in one of the first, second and third stress modules SM1, SM2 and SM3 corresponds in its use to an associated failure attribute (e.g., a first failure attribute, a second failure attribute, and a third failure attribute).

Using this configuration and during a wafer-level test operation, the tester 10 will perform one or more test and/or repair operations with respect to the first memory chip 21. In this manner, the tester 10 may acquire repair information associated with the first memory chip 21. Thereafter, the tester 10 may be used to derive (or extract) failure attribute information from the repair information associated with the first memory chip 21. For example, given its type, configuration, or series, the first memory chip 21 may have one or more known failure-mode vulnerabilities (e.g., the first failure attribute, second failure attribute and third failure attribute). Accordingly, the tester 10 may be used to appropriately stress relevant circuitry of the first memory chip 21 corresponding to the first failure attribute, second failure attribute, and third failure attribute during (e.g.,) burn-in testing.

With respect to the example shown in FIG. 2, a method of testing the first memory chip 21 may proceed as follows. The tester 10 may apply a test mode register set (TMRS) signal (e.g., a type of stress permission start signal) to the first storage unit SU1 of the first memory chip 21. In response to the TMRS signal, the first storage unit SU1 may communicate first failure attribute information including first timing control information associated with the first failure attribute to the first logic control circuit LCC1. The first logic control circuit LCC1 may then set the first timer TM1 using the first timing control information, and otherwise control the operation of the first BISS/BIST circuitry (BBL1).

Thus, under the control of the first logic control circuit LCC1, the first BISS/BIST circuitry BBL1 may be used to apply appropriately defined stress signal(s) (e.g., voltages and/or currents) to the memory cell array CA during a first time period controlled by the first timer TM1. When first failure attribute operation(s) are completed by the first stress module SM1, the first BISS/BIST circuitry BBL1 will communicate a first stress operation start signal SOS1 to the second storage unit SU2.

Here, if the first memory chip 21 does not need to be tested for the first failure attribute, the first logic control circuit LCC1 may simply set the first timing control information for the first timer TM1 to "0".

In similar manner, and in response to corresponding second and third stress operation start signals (SOS1 and SOS2), the second stress module SM2 and the third stress module SM3 may be used to provide second failure attribute information and third failure attribute information, respectively. Thus, the tester 10 may selectively and effectively apply different stress tests associated with different failure attributes to a plurality of memory chips being simultaneously tested. One approach to applying different stress tests associated with different failure attributes to a plurality of memory chips being simultaneously tested will be described in some additional detail with respect to FIGS. 5 and 6.

Figure 3:
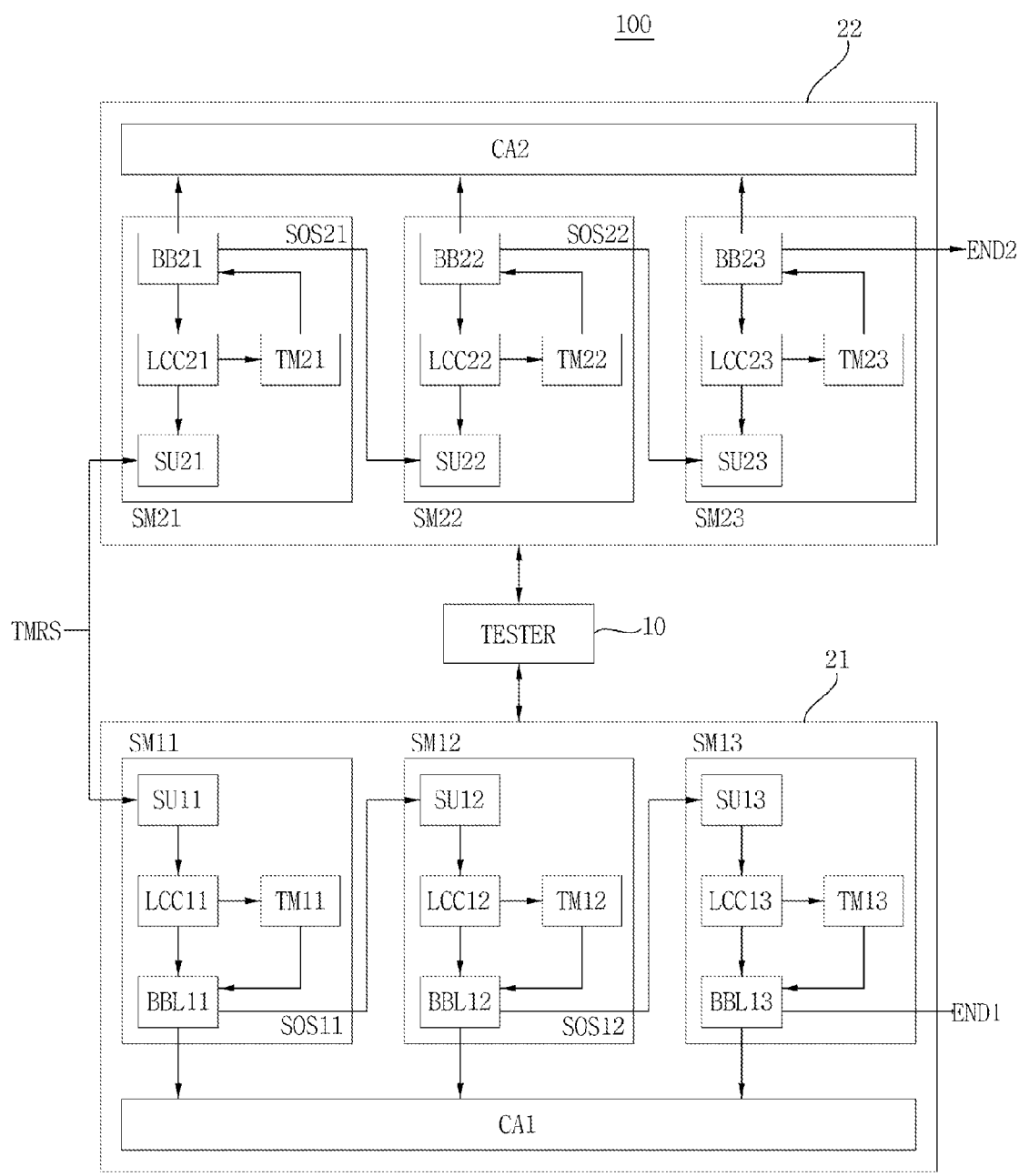
FIG. 3 is a block diagram illustrating a test system according to another embodiment of the inventive concept.

FIG. 3 is a block diagram illustrating a test system according to another embodiment of the inventive concept.

Referring to FIGS. 1, 2 and 3, the tester 10 is now expressly used to simultaneously test the first memory chip 21 and the second memory chip 22. Here again, the first memory chip 21 includes first, second and third stress modules SM11, SM12 and SM13, as well as a first cell array CA1. The first stress module SM11, as an example, includes a first storage unit SU11, a first logic control circuit LCC11, a first timer TM11, and a first BISS/BIST circuitry BBL11. The second stress module SM12 and third stress module SM13 are similarly configured.

As before, the first storage unit SU11 (and by analogous extension, the second storage unit SU12 and third storage unit SU13) may be used to store first (second and third) attribute failure information associated with a first (second and third) failure attribute and including timing control information for the first (second and third) timer TM11. In this manner, each of the first, second and third storage units SU11 to SU13 correspond to a failure attribute that may be exhibited by the first memory chip 21.

This exemplary configuration for the first memory chip 21 is mirrored in FIG. 3 with respect to the second memory chip 22, and corresponding components are analogously labeled. Accordingly, the first, second and third storage units SU21 to SU23 of the second memory chip 22 corresponds to respective failure attributes (e.g., the first stress module SM21 corresponds to the first failure attribute, the second stress module SM22 corresponds to the second failure attribute, and the third stress module SM23 corresponds to the third failure attribute).

As has been previously noted, during a wafer-level test operation, the tester 10 may simultaneously test the first memory chip 21 and the second memory chip 22, and acquire repair information respectively associated with the first memory chip 21 and second memory chip 22. And from this repair information, the tester 10 may be used to extract failure attribute information associated with the first memory chip 21 and the second memory chip 22, respectively. For example, using this approach it may be determined that the first memory chip 21 is vulnerable to a first failure attribute and a third failure attribute, while the second memory chip 22 is vulnerable to the first failure attribute and a second failure attribute. Accordingly, the tester 10 may then be used to apply appropriately defined stress signals corresponding to the first failure attribute and third failure attribute to the first memory chip 21 during burn-in testing, and simultaneously, apply appropriately defined stress signals corresponding to the first failure attribute and second failure attribute to the second memory chip 22 during burn-in testing.

The foregoing approach may accomplish appropriate stress testing of both memory chips. Thus, assuming that a first, a second and a third stress test respectively associated with the first, second and third failure attributes each require about 20 minutes to perform, the following outcome occurs for the example described above. In the first memory chip 21, the first stress module 11 performs the first stress test with respect to the first memory cell array CA1 for 20 minutes, the second stress module 12 omits a second stress test with respect to the first cell array CA1 (i.e., a second stress time is set to 0), and the third stress module 13 performs the third stress test with respect to the first cell array CA1 for an additional 20 minutes.

While the tester 10 controls execution of the first, second and third stress tests with respect to the first memory chip 21, it also controls execution of the first, second and third stress test with respect to the second memory chip 22. Thus, under the same assumptions noted above and in relation to the second memory chip 22, the first stress module SM21 performs the first stress test with respect to the second cell array CA2 for 20 minutes, the second stress module SM22 performs the second stress test with respect to the second cell array CA2 for an additional 20 minutes, and the third stress module SM23 omits the third stress test with respect to the second cell array CA2 (i.e. a third stress time is set to 0).

In the foregoing approach, the tester 10 may simultaneously apply the TMRS signal to the first memory chip 21 and second memory chip 22. That is, the first storage unit SU11 of the first memory chip 21 and the first storage unit SU21 in the second memory chip 22 receives the TMRS signal at the same time. Thereafter, the tester 10 controls the selective application of first, second and/or third stress tests associated with the first, second and/or third failure attributes to each of the first and second memory chips 21 and 22. In this regard, the operation of the respective stress modules SMxx, constituent storage units (SUxx), logic control circuits LCCxx, timers TMxx, and BISS/BIST circuitry BBLxx may be the same as previously described, albeit with respect to both the first memory chip 21 and second memory chip 22. Once a final stress module in a series of stress modules for each memory chip has caused a corresponding stress signal to be applied to a memory cell array, and end signal (e.g., END1 and END2) are returned to the tester 10.

Figure 4:
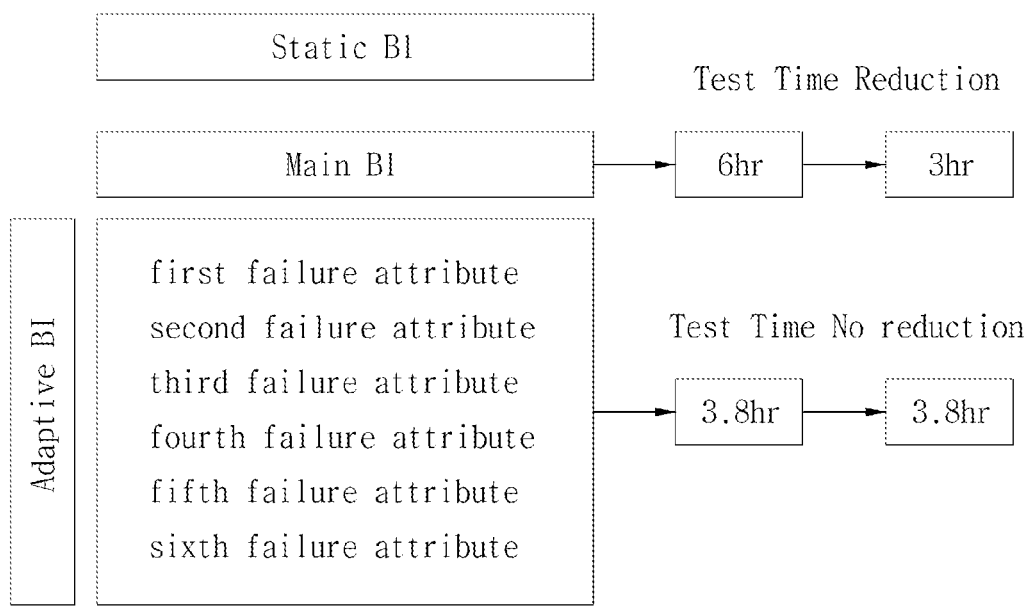
FIG. 4 shows a general package burn-in (BI) operation.

FIG. 4 is a conceptual diagram illustrating a burn-in (BI) operation for semiconductor devices.

Referring to FIGS. 1 and 4, during a period of increasing temperature during a static BI operation, the tester 10 applies only requisite power supply voltage(s) to the plurality of memory chips 20. In this context, the tester 10 may be said to "run" (i.e., cause, control and/or monitor the execution of) various burn-in operations. Once a high temperature limit of the static BI operation is reached, the tester 10 may then apply one or more stress signals to the plurality of memory chips 20 during a main BI operation.

In the context of the inventive concept, the duration of the main BI operation may be reduced from 6 hours to 3 hours, and an adaptive BI operation may be added to essentially pre-detect various failure attributes that are potentially unresolved by the main BI operation. Here, the adaptive BI operation may include the selective application of particular stress signals corresponding to known (or suspected) failure attributes (e.g., the first, second, third, fourth, fifth, and sixth failure attributes suggested in FIG. 4) previously associated with the individual memory chips constituting the plurality of memory chips 20. However, the universal inclusion of testing associated with every failure attribute for every memory chip in the plurality of memory chips being tested may result in an unreasonably long test period and may overly stress memory chips.

In contrast to this potential outcome, FIG. 5 conceptually illustrates a set of relationships between failure attributes and respective memory chips in the plurality of memory chips being tested by a test system like the one described above in relation to FIG. 1. Referring to FIGS. 1 and 5, incidences of first through sixth failure attributes for first through fourth memory chips 21 to 24 is illustrated. Here, it is assumed that each of the first through fourth memory chips 21 to 24 includes first through sixth stress modules (SM) respectively corresponding to the first through sixth failure attributes. It is further assumed that based on relevant failure attribute information, the first memory chip 21 is susceptible to the first, second and third failure attributes; the second memory chip 22 is susceptible to the fourth, fifth and sixth failure attributes; the third memory chip 23 is susceptible to the first and sixth failure attributes, and the fourth memory chip 24 is susceptible to the second and fourth failure attributes.

Here again, assuming for the sake of simplicity that each one of first, second, third, fourth, fifth and sixth stress tests respectively associated with the first, second, third, fourth, fifth and sixth failure attributes takes a minimum of 20 minutes, sequentially applying all of the first through sixth stress tests to each of the first to fourth memory chips would 120 minutes. However, embodiments of the inventive concept are capable of characterizing multiple failure attributes, and more specifically ascribing selected failure attributes to each memory chip being tested. Therefore, unnecessary testing and the resultant stress may omitted from more memory chip-specific testing regimes, as further described with respect to FIG. 6.

FIG. 6 conceptually illustrates a set of relationships between selected failure attributes and respective memory chips in the plurality of memory chips being tested by a test system like the one described above in relation to FIG. 1. Referring to FIGS. 1, 5 and 6, markedly reduced total test times (e.g., periods between a start time (TS) and end times (TO)) for the first through fourth memory chips may be achieved.

Instead of applying each one of the first through sixth stress tests using corresponding stress modules, the first memory chip, for example, need only apply the first, second and third stress tests associated with the first, second and third failure attributes. Similarly, the second memory chip need only apply the fourth, fifth and sixth stress tests; the third memory chip need only apply the first and sixth stress test, and the fourth memory chip need only apply the second and fourth stress tests.

Accordingly, instead of the fixed 120 minute testing time for the first through fourth memory chips, a worst case total testing time (i.e., the testing period associated with the testing of the first and second memory chips) may be reduced to 60 minutes, per the example illustrated in FIG. 6. Further, respective time periods for stress testing of the third and fourth memory cells may be expanded as necessary within the total testing time required for the plurality of memory chips being tested. This may also reduce unnecessary or unwanted stress of the memory chips.

Figure 7:
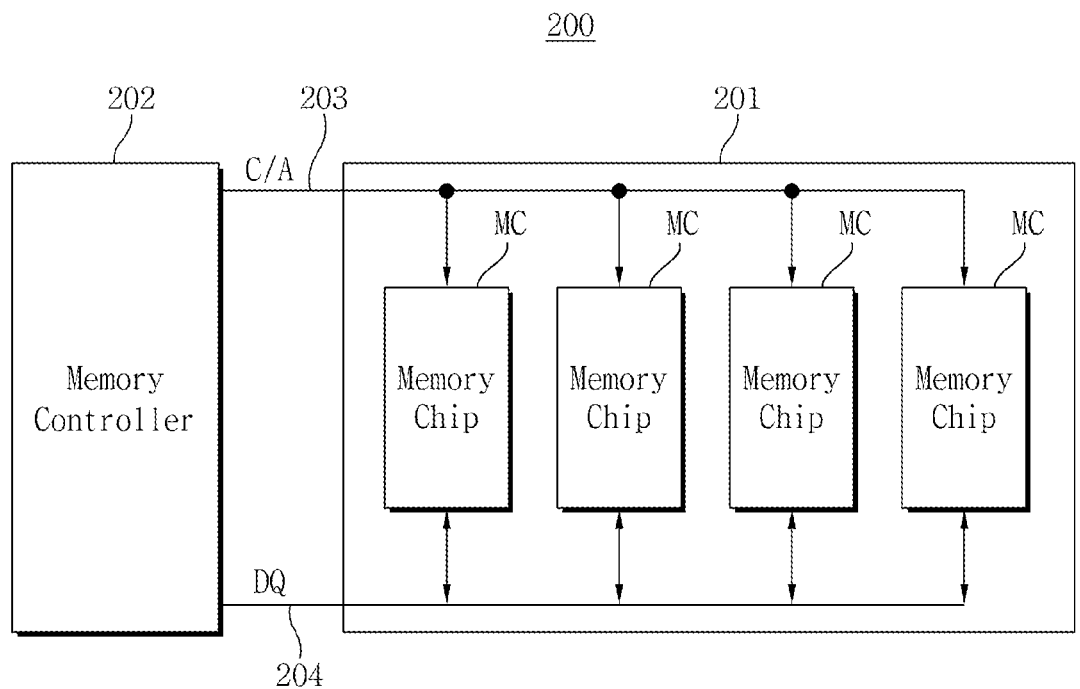
FIG. 7 is a block diagram of a memory system 200 including memory chips 21 shown in FIG. 1.

FIG. 7 is a block diagram illustrating a memory system 200 comprising a memory module 201 including a plurality of memory chips and a memory controller 202.

The illustrated memory module 201 is assumed to mechanically mount and electrically connect four (4) memory chips MC, but many other memory module configurations might be used in other embodiments of the inventive concept. For example, memory chips may be mounted on both sides of a primary substrate within a memory module.

The memory controller 202 may be used to generate command/address signal(s) (C/A) as well as a data signal (DQ). The memory module 201 and its constituent memory chips operated in response to the command/address signal C/A and/or data signal DQ. In certain embodiments of the inventive concept, the command/address signal C/A will be communicated as packet data combining command data and address data in a defined packet type.

The command/address bus 203 may have a fly-by structure and electrically connect the four memory chips MC. The data signal DQ may be communicated via the data bus 204 between the memory controller 202 and memory module 201. Further, each one of the memory chips MC shown in the example of FIG. 7 may be similarly configured and operated as the first memory chip 21 described above with reference to FIGS. 1 and 2.

Figure 8:
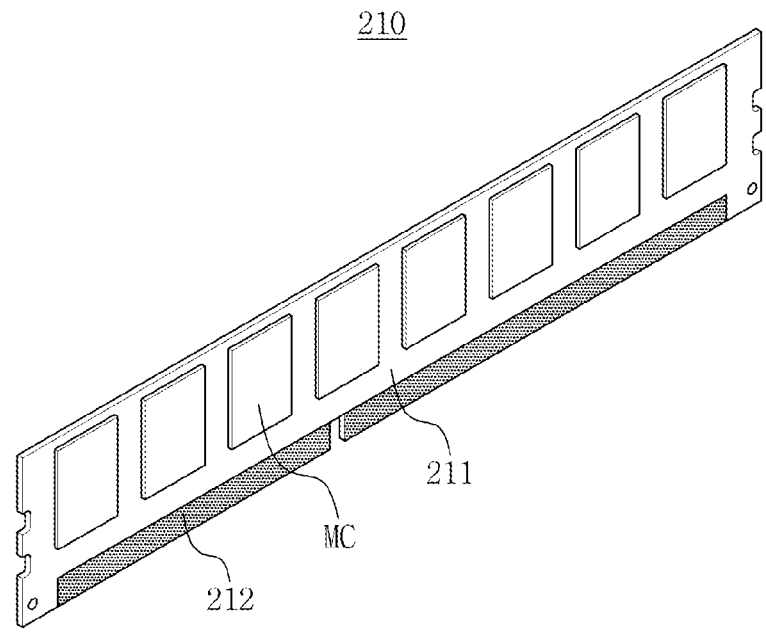
FIGS. 8 through 10 are diagrams of memory modules 210, 220, and 230 including memory chips 21 shown in FIG. 1.
Figure 9:
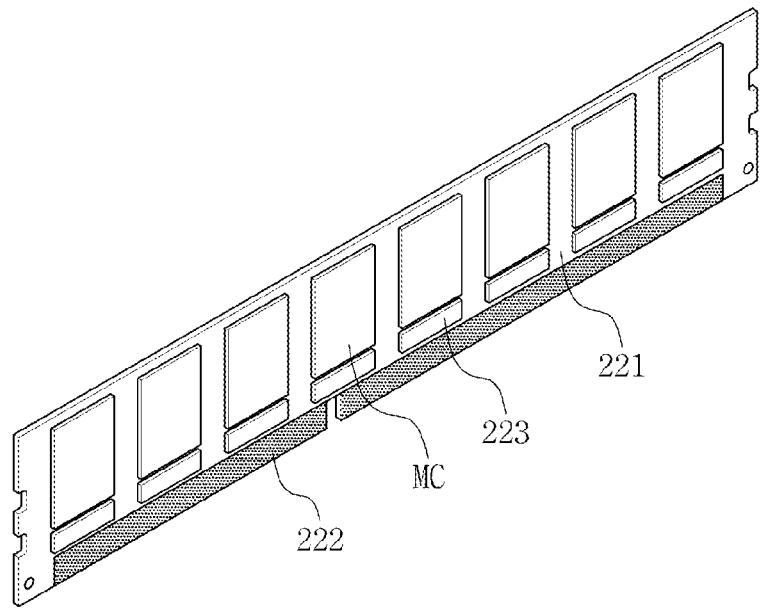
Figure 10:
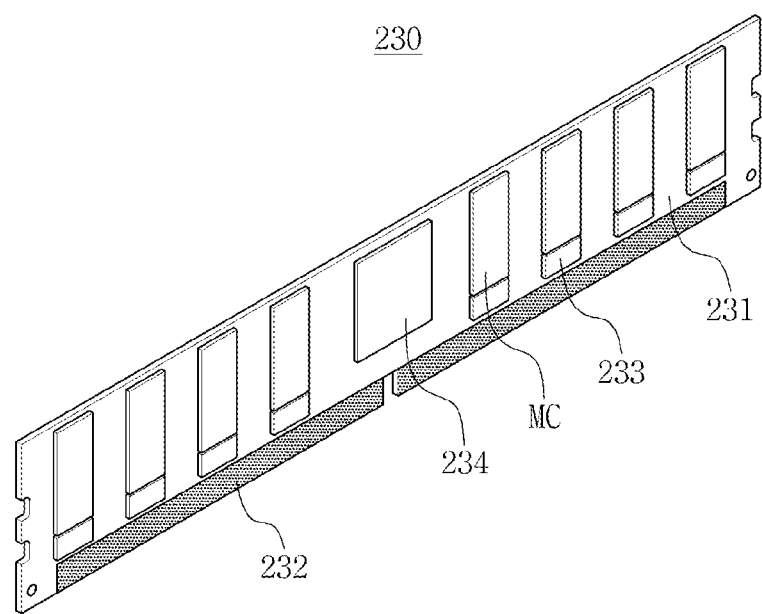

FIGS. 8, 9 and 10 are perspective diagrams respectively illustrating memory modules 210, 220, and 230 that may be configured to mount memory chips MC similarly configured and operated as the first memory chip 21 described above with reference to FIGS. 1 and 2.

Referring to FIG. 8, the memory module 210 includes memory chips MC mounted on a printed circuit board (PCB) 211 having a connector 212. The memory chips MC may be bonded to top and bottom surfaces of the PCB 211, and the connector 212 may be used to electrically connect the memory chips MC via a multiplicity of conductive lines (not shown). In various configurations, the connector 212 may be connected to a slot of a host (not shown).

Referring to FIG. 9, the memory module 220 includes a PCB 221, memory chips MC, a connector 222, and buffers 223. Each of the buffers 223 is disposed between a memory chip MC and connector 222. Each of the buffers 233 connected to each of the memory chips MC may be provided on top and bottom surfaces of the PCB 221. The memory chips MC and buffers 223 formed on the top and bottom surfaces of the PCB 221 may be connected via a plurality of via holes.

Referring to FIG. 10, the memory module 230 includes a memory chips MC, a PCB 231, a connector 232, buffers 233, and a controller 234.

Each of the buffers 233 is connected to a memory chip MC on top and bottom surfaces of the PCB 231. The memory chips MC and buffers 233 formed on the top and bottom surfaces of the PCB 231 may be connected via a plurality of via holes. The controller 234 communicates a control signal to each of the memory chips MC and communicates data with each of the memory chips MC.

Figure 11:
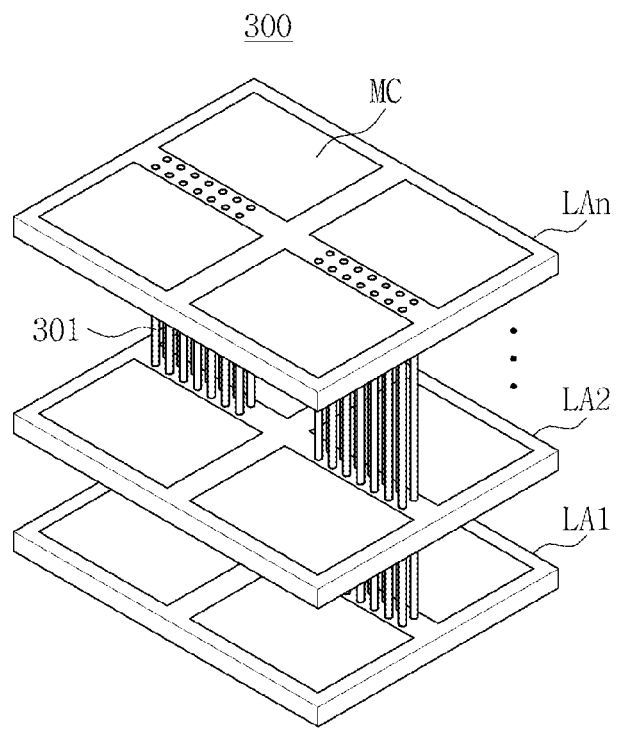
FIG. 11 is a conceptual diagram illustrating a semiconductor device 300 which has a stacked structure and includes a plurality of semiconductor layers according to an embodiment of the inventive concept.

FIG. 11 is a perspective diagram illustrating a semiconductor device 300 having a stacked structure and including a plurality of semiconductor layers.

In the memory modules 210, 220, and 230 shown in FIGS. 8, 9 and 10, each of the memory chips MC may include a plurality of semiconductor layers LA1 to LAn.

Referring to FIG. 11, in the semiconductor device 300, the plurality of stacked semiconductor layers LA1 to LAn may be connected to each other through through-silicon vias (TSVs) 301.

Figure 12:
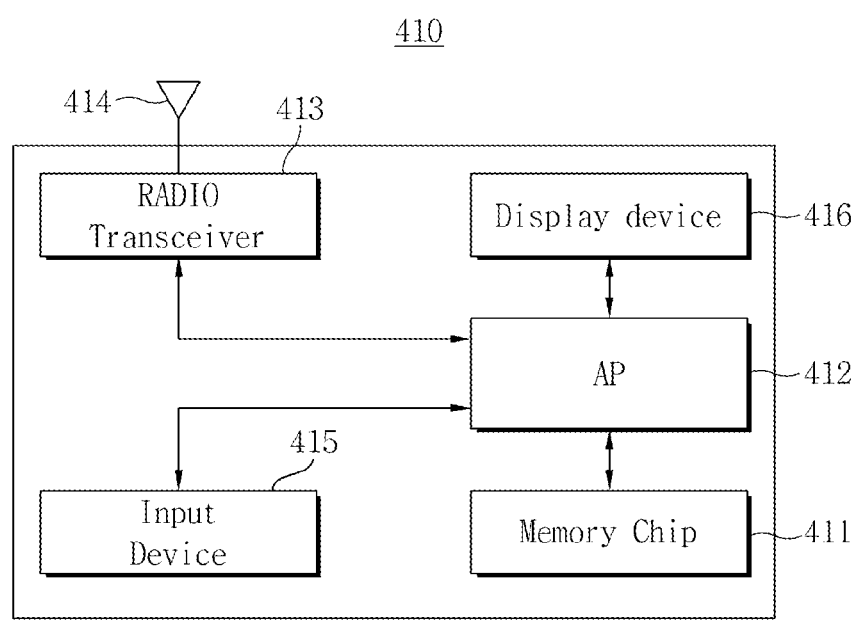
FIG. 12 is a block diagram of a computer system 410 including the memory chip 21 shown in FIG. 1, according to an embodiment of the inventive concept.

FIG. 12 is a block diagram illustrating a computer system 410 comprising one or more memory chips like the first memory chip 21 shown in FIGS. 1 and 2 according to an embodiment of the inventive concept.

Referring to FIG. 12, the computer system 410 comprises a memory chip 411, an application processor (AP) 412, a radio transceiver 413, an antenna 414, an input device 415, and a display device 416, where the AP 412 includes a memory controller for controlling the memory chip 411.

The radio transceiver 413 may be used to communicate a wireless signal via the antenna 414. For example, the radio transceiver 413 may modulate a wireless signal to a signal to be processed in the AP 412.

Accordingly, the AP 412 may process a signal output from the radio transceiver 413 and transmit the processed signal to display device 416. Moreover, the radio transceiver 413 may modulate the signal output from the AP 412 to a wireless signal and output the modulated wireless signal through the antenna 414 to an external device.

The input device 415 is a device capable of inputting a control signal for controlling an operation of the AP 412 or a data processed by the AP 412 and may be implemented as a pointing device such as a touch pad and computer mouse, a keypad, or a keyboard.

Figure 13:
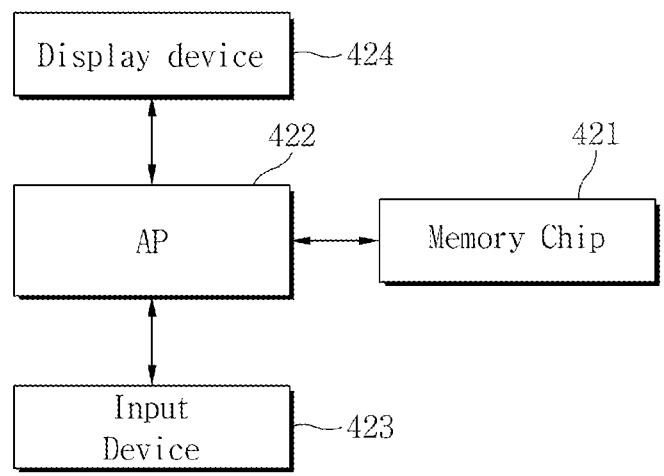
FIG. 13 is a block diagram of a computer system 420 including the memory chip 21 shown in FIG. 1, according to another embodiment of the inventive concept.

FIG. 13 is a block diagram illustrating a computer system 420 that may include one or more memory chips like the first memory chip 21 described in relation to FIGS. 1 and 2 according to another embodiment of the inventive concept.

Referring to FIG. 13, the computer system 420 may be implemented as a personal computer (PC), a network server, a tablet PC, a net-book, e-reader, personal digital assistant (PDA), a portable multimedia player (PMP), a MP3 player, a MP4 player.

The computer system 420 may include a memory chip 421, an AP 422, an input device 423, and a display device 424.

The AP 422 may include a memory controller for controlling the memory chip 421. The AP 422 may output data stored in the memory chip 421 through the display device 424 according to data input through the input device 423.

For example, the input device 4230 may be implemented as a pointing device such as a touch pad or computer mouse, a keypad, or a keyboard. The AP 422 may control overall operations of the computer system 420 and control an operation of the memory chip 421.

Here, the memory chip 421 be configured and operated like the first memory chip 21 of FIGS. 1 and 2.

Figure 14:
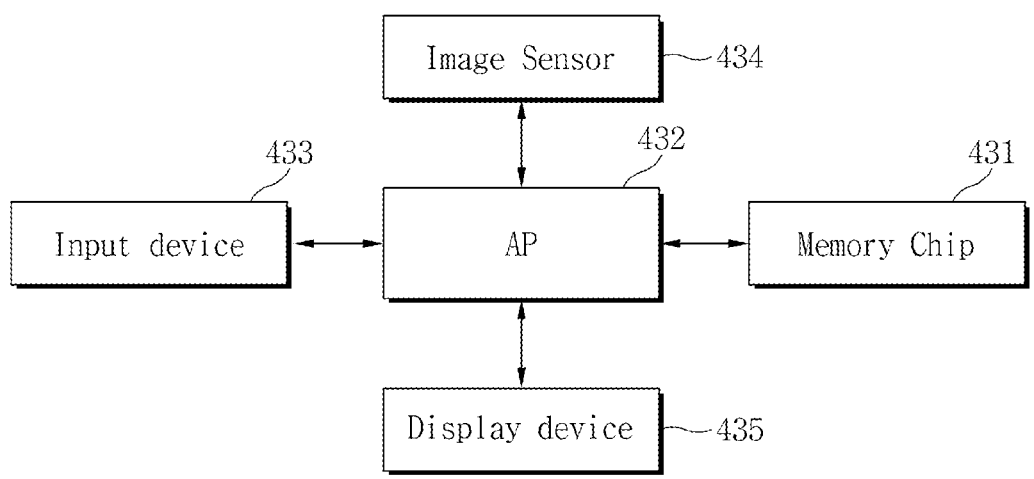
FIG. 14 is a block diagram of a computer system 430 including the memory chip 21 shown in FIG. 1, according to still another embodiment of the inventive concept.

FIG. 14 is a block diagram illustrating a computer system 430 that may include one or more memory chips like the first memory chip 21 described in relation to FIGS. 1 and 2 according to still another embodiment of the inventive concept.

Referring to FIG. 14, the computer system 430 may be implemented as an image process device such as a digital camera or a mobile telephone having a digital camera, a smart phone or a tablet PC.

The computer system 430 may include a memory chip 431, an AP 432, an input device 433, an image sensor 434, and a display device 435. The AP 432 may include a memory controller for controlling the memory chip 431.

The image sensor 434 may convert an optical image to a digital signal and transmit the converted digital signal to AP 432. According to control of the AP 432, the converted digital signal may be displayed through the display device 435 or stored in the memory chip 431.

Further, data stored in the memory chip 431 may be displayed through display device 435 according to control of the AP 432.

The input device 433 is a device capable of inputting a control signal for controlling an operation of the AP 432 or a data processed by the AP 432 and may be implemented as a pointing device such as a touch pad and computer mouse, a keypad, or a keyboard.

In the embodiment illustrated in FIG. 14, the memory chip 431 may be configured and operated like the first memory chip 21 described in relation to FIGS. 1 and 2.

A test system according to embodiments of the inventive concept may be used to reduce the total testing time required to test a plurality of semiconductor devices, such as memory chips. This may be accomplished by differently applying selected stress tests to the individual memory chips, thereby reducing unnecessary testing time and resulting unnecessary stress on the memory chips.

Here, individual memory devices according to embodiments of the inventive concept are capable of operating BISS/BIST circuitry to independently perform selected stress tests based suspected failure attributes for each memory chip.

Certain embodiments of the inventive concept may be applied to mobile devices and/or computer systems includes one or more memory chips.

Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A test system comprising:
a plurality of memory chips and a tester external to the plurality of memory chips and configured to generate a test mode register set (TMRS) signal,
wherein the plurality of memory chips comprises a first memory chip and a second memory chip, the first memory chip includes a first memory cell array including memory cells susceptible to a first failure attribute, a first storage unit that stores first failure attribute information, and first built-in self-test (BIST)/built-in self-stress (BISS) circuitry, and the second memory chip includes a second memory cell array including memory cells susceptible to a second failure attribute different from the first failure attribute, a second storage unit that stores second failure attribute information, and second BIST/BISS circuitry,
in response to the TMRS signal, the first storage unit provides the first failure attribute information to the tester and the second storage unit provides the second failure attribute information to the tester, and thereafter,
the first BIST/BISS circuitry, the second BIST/BISS circuitry and tester are collectively configured in response to the first failure attribute information and second failure attribute information to simultaneously apply a first stress test associated with the first failure attribute to the first memory chip, and a second stress test associated with the second failure attribute and different from the first stress test to the second memory cell chip.

2. The test system of claim 1, wherein the first stress test is defined at least in part by the first failure attribute information, and the second stress test is defined at least in part by the second failure attribute information.

3. The test system of claim 2, wherein the first memory chip comprises a first stress module including the first storage unit, a first logic control circuit, a first timer, and the first BIST/BISS circuitry, wherein the first logic control circuit controls operation of the first timer and the first BISS/BIST circuitry in response to the first failure attribute information; and
the second memory chip comprises a second stress module including the second storage unit, a second logic control circuit, a second timer, and the second BIST/BISS circuitry, wherein the second logic control circuit controls operation of the second timer and the second BISS/BIST circuitry in response to the second failure attribute information.

4. The test system of claim 3, wherein the first failure attribute information includes first timing control information that controls operation of the first timer, and the second failure attribute information includes second timing control information that controls operation of the second timer.

5. The test system of claim 3, wherein the first storage unit and the second storage unit are configured with at least one of laser fuse, e-fuse, and anti-fuse elements.

6. The test system of claim 1, wherein the tester is configured to perform a wafer-level test on the plurality of memory chips during which repair information associated with the first memory chip and second memory chip is acquired, and
the tester is further configured to generate the first failure attribute information from repair information acquired from the first memory chip, and to generate the second failure attribute information from repair information acquired from the second memory chip.

7. The test system of claim 1, wherein the tester is configured to run a static burn-in operation during which the plurality of memory chips is subjected to increasing temperature while the tester provides a power supply voltage to each one of the plurality of memory chips.

8. The test system of claim 7, wherein the tester is further configured to run an adaptive burn-in operation following the static burn-in operation during which the first BIST/BISS applies the first stress test to the first memory cell array of the first memory chip, while the second BIST/BISS applies the second stress test to the second memory cell array of the second memory chip.

9. The test system of claim 1, wherein each one of the plurality of memory chips is mechanically mounted on and electrically connected to the tester via a memory module.

10. A method of simultaneously testing a plurality of memory chips arranged on a wafer and including a first memory chip and a second memory chip using a tester external to the wafer, wherein the first memory chip includes a first memory cell array and a first stress module including a first storage unit and first built-in self-test (BIST)/built-in self-stress (BISS) circuitry and the second memory chip includes a second memory cell array and a second stress module including a second storage unit and second BIST/BISS circuitry, the method comprising:
communicating first failure attribute information stored in the first storage unit from the first memory chip to the tester, and communicating second failure attribute information stored in the second storage unit from the second memory chip to the tester; and thereafter,
configuring the first BIST/BISS circuitry to selectively apply a first stress test associated with a first failure attribute to the first memory cell array; and configuring the second BIST/BISS circuitry to selectively apply a second stress test associated with a second failure attribute different from the first failure attribute to the second memory cell array, wherein the first stress test is defined at least in part from the first failure attribute information, the second stress test is different from the first stress test and is defined at least in part from the second failure attribute information, and the first and second stress tests are simultaneously and respectively applied to the first memory cell array and the second memory cell array.

11. The method of claim 10, wherein the first stress module further includes a first timer and first logic control circuitry and the second stress module further includes a second timer and second logic control circuitry, the method further comprising:

using the first timer and the first logic control circuitry to determine that memory cells of the first memory cell array are susceptible to the first failure attribute, generating the first failure attribute information, and storing the first failure attribute information in the first storage unit; and simultaneously, using the second timer and the second logic control circuitry to determine that memory cells of the second memory cell array are susceptible to the second failure attribute, generating second failure attribute information and storing the second failure attribute information in the second storage unit.

12. The method of claim 10, wherein each one of the first storage unit and second storage unit is configured with at least one of laser fuse, e-fuse, and anti-fuse elements.

13. The method of claim 10, wherein the communicating of the first failure attribute information and the communicating of the second failure attribute information is performed in response to a test mode register set (TMRS) signal generated by the tester and simultaneously applied to the plurality of memory chips.

14. The method of claim 10, further comprising:

connecting the tester to a memory module mechanically mounting and electrically connecting the plurality of memory chips.

15. A method of simultaneously testing a plurality of memory chips arranged on a wafer and including a first memory chip and a second memory chip using a tester external to the wafer, the method comprising:

performing a wafer-level test on the plurality of memory chips during which repair information associated with the first memory chip including a first memory cell array and second memory chip including a second memory cell array is acquired by the tester;

generating in the tester first failure attribute information associated with a first failure attribute for memory cells in the first memory cell array from repair information associated with the first memory chip, and storing the first failure attribute information in a first storage unit disposed on the first memory chip;

generating in the tester second failure attribute information associated with a second failure attribute, different from the first failure attribute, for memory cells in the second memory cell array from repair information associated with the second memory chip, and storing the second failure attribute information in a second storage unit disposed on the second memory chip; and thereafter, simultaneously testing the plurality of memory chips by applying a first stress test defined at least in part by the first failure attribute information to the first memory chip, while applying a second stress test different from the first stress test and defined at least in part by the second failure attribute information to the second memory chip.

16. The method of claim 15, further comprising:

running an adaptive burn-in operation during which first built-in self-test (BIST)/built-in self-stress (BISS) circuitry disposed on the first memory chip applies the first stress test to the first memory cell array of the first memory chip, and simultaneously second BIST/BISS circuitry disposed on the second memory chip applies the second stress test to the second memory chip.

17. The method of claim 15, further comprising:

before running the adaptive burn-in operation, running a static burn-in operation during which the plurality of memory chips is subjected to increasing temperature while the tester provides a power supply voltage to each one of the plurality of memory chips.

18. The method of claim 15, wherein the plurality of memory chips is mechanically mounted on and electrically connected by a memory module.

* * * * *